(12) United States Patent
Lim (10) Patent No.: US 10,879,476 B1
(45) Date of Patent: Dec. 29, 2020

(54) ORGANIC THIN FILM TRANSISTOR AND METHOD OF MANUFACTURING THE SAME

(71) Applicant: Korea Research Institute of Standards and Science, Daejeon (KR)

(72) Inventor: Kyung Geun Lim, Busan (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 16/776,627

(22) Filed: Jan. 30, 2020

(30) Foreign Application Priority Data

Nov. 20, 2019 (KR) .................. 10-2019-0149774

(51) Int. Cl.
*H01L 51/05* (2006.01)
*H01L 29/66* (2006.01)
*H01L 29/786* (2006.01)

(52) U.S. Cl.
CPC .... *H01L 51/0558* (2013.01); *H01L 29/66742* (2013.01); *H01L 29/7869* (2013.01)

(58) Field of Classification Search
CPC ............ H01L 51/0558; H01L 29/7869; H01L 29/66742
See application file for complete search history.

(56) References Cited

FOREIGN PATENT DOCUMENTS

KR    1020110136186 A    12/2011

OTHER PUBLICATIONS

Kyung-Geun Lim, et al., "Vertical Organic Thin Film Transistor with Electrochemically Anodized Electrodes for Very Low Leakage Current and High Charge-carrier Transmission," Korea Research Institution for Standard Science, (FD1-J-2), (Feb. 13, 2019).
Felix Dollinger, et al., "Vertical Organic Thin-Film Transistors with an Anodized Permeable Base for Very Low Leakage Current," Advanced Materials, Wiley-VCH Verlag GmbH & Co., KGaA, Weinheim, (1900917), (p. 1-5) 2019.
Wenchao Chen et al., Intrinsic delay of permeable based transistor, Journal of Applied Physics 116, 044505, AIP Publishing, (2014).
Martin Kaltenbrunner et al., Anodized Aluminum Oxide Thin Films for Room Temperature Processed, Flexible, Low-Voltage Organic Non-Volatile Memory Elements with Excellent Charge Retention, Advanced Materials, Wiley-VCH, 2011, 23, pp. 4892-4896.
Felix Dollinger et al., Vertical Organic Thin-Folm Transistors with an Anodized Permeable Base for Very Low Leakage Current, Advanced Materials, Wiley-VCH, 2019,. 31, pp. 1900917 (1-5).
Korean Office Action dated Sep. 16, 2020 for corresponding Korean Patent Application KR 10-2019-0149774.

*Primary Examiner* — Anthony Ho
(74) *Attorney, Agent, or Firm* — Hammer & Associates, P.C.

(57) ABSTRACT

An organic thin film transistor (OTFT) is provided. The OTFT includes a substrate, a first electrode layer disposed on a top surface of the substrate, an organic active layer disposed on a top surface of the first electrode layer, a second electrode layer disposed in the organic active layer and including a base electrode, a plurality of pinholes formed in the base electrode and providing charge transfer paths, and a metal oxide configured to surround a surface of the base electrode and the pinholes, and a third electrode layer disposed on the organic active layer.

17 Claims, 6 Drawing Sheets

ORGANIC THIN FILM TRANSISTOR AND METHOD OF MANUFACTURING THE SAME

CROSS-REFERENCE TO RELATED APPLICATION

This application claims priority to and the benefit of Korean Patent Application No. 10-2019-0149774, filed Nov. 20, 2019, the disclosure of which is incorporated herein by reference in its entirety.

BACKGROUND

1. Field of the Invention

The present invention relates to an organic thin film transistor (OTFT) and a method of manufacturing the same.

2. Discussion of Related Art

Thin film transistors (TFTs) are used as driving elements for controlling operations of pixels in various display devices and are expected to be utilized in plastic chips for smart cards or inventory tags.

Conventionally, an inorganic semiconductor material such as silicon (Si) has been generally used for channel layers of the TFTs. However, recently, owing to the enlargement, low price, and flexibility of displays, inorganic-based materials having a high price and requiring high temperature vacuum process are being changed to organic-based semiconductor materials. Recently, research on organic thin film transistors (OTFTs) using organic thin films as semiconductor layers has been actively carried out.

The OTFTs employ organic thin films as semiconductor layers instead of silicon film. According to materials of the organic thin films, the OTFTs are divided into low-molecular OTFTs employing low-molecular semiconductor materials such as oligothiophene, pentacene, or the like, and polymer OTFTs employing semiconductor polymer materials such as polythiophene series or the like. Electrical performance of semiconductor polymers is much higher when compared to that of organic semiconductors obtained by thermally evaporating low-molecular materials such as pentacene and the like.

SUMMARY OF THE INVENTION

The present invention is directed to providing an organic thin film transistor (OTFT) having a vertical deposition structure and a method of manufacturing the same.

The present invention is also directed to providing an OTFT having an improved transition frequency and a method of manufacturing the same.

The present invention is also directed to providing an OTFT having an improved on/off ratio and a method of manufacturing the same.

The present invention is also directed to providing an OTFT having an improved transmission factor and a method of manufacturing the same.

The present invention is also directed to providing an OTFT, in which uniform pinholes and a charge blocking layer having a metal oxide characteristic are formed, and a method of manufacturing the same.

The present invention is also directed to providing an OTFT having high durability and a method of manufacturing the same.

The present invention is also directed to providing an OTFT with a reduced leakage current and a method of manufacturing the same.

The present invention is also directed to providing an OTFT and a method of manufacturing the same which is capable of selectively precisely controlling a thickness of a metal oxide of a charge blocking layer during a manufacturing process.

One aspect of the present invention provides an organic thin film transistor (OTFT) including a substrate, a first electrode layer disposed on a top surface of the substrate, an organic active layer disposed on a top surface of the first electrode layer, a second electrode layer disposed in the organic active layer and including a base electrode, a plurality of pinholes formed in the base electrode and providing charge transfer paths, and a metal oxide configured to surround a surface of the base electrode and the pinholes, and a third electrode layer disposed on the organic active layer.

The metal oxide may include at least one selected from the group consisting of yttrium oxide ($Y_2O_3$), aluminum oxide ($Al_2O_3$ or $AlO_x$), magnesium oxide ($MgO_x$), zinc oxide (ZnO), tin oxide (SnO), iron oxide ($Fe_2O_3$ or $FeO_x$), titanium oxide ($TiO_x$), zirconium oxide ($ZrO_2$), chromium oxide ($Cr_2O_3$), hafnium oxide (HfO), beryllium oxide (BeO), tungsten oxide ($WO_x$), copper oxide ($CuO_x$), silicon oxide ($SiO_x$), and nickel oxide ($NiO_x$) (here, x is a rational number between 1 and 3).

The metal oxide may be formed through anodizing.

The metal oxide may be formed by immersing the base electrode in an acidic solution and then applying a voltage between an auxiliary electrode and the base electrode in the acidic solution.

A thickness and a shape of the metal oxide may be determined by at least one among a pH of the acidic solution, a solution composition, a solution concentration, a dissolved metal ion concentration, a temperature of the acidic solution, a stirring speed of the acidic solution, an applied current density, types of applied current (direct current (DC), alternating current (AC), or pulse current), a metal alloy composition, a pretreatment method, a thickness and a shape of the base electrode, and a size and a shape of the auxiliary electrode.

A transition frequency of the OTFT may exceed 40 MHz.

A transmission factor of the OTFT may be 99.99% or more.

An on/off ratio of the OTFT may be $10^5$ or more.

An on-current-density of the OTFT may be 300 mA/cm$^2$ or more.

The base electrode may be made of Al, and the metal oxide may be made of AlOx which is an anodized base electrode.

Another aspect of the present invention provides a method of manufacturing an organic thin film transistor (OTFT) including providing a substrate, forming a first electrode layer on the substrate, arranging a bottom layer of an organic semiconductor and a base electrode on the first electrode layer, anodizing the base electrode, arranging a top layer of the organic semiconductor on the bottom layer of the organic semiconductor and the base electrode, and forming a third electrode layer on an active layer including the organic semiconductor and a base metal, wherein the anodizing includes forming a second electrode layer including the base electrode, a plurality of pinholes formed in the base electrode and providing charge transfer paths, and a metal oxide configured to surround a surface of the base electrode and the pinholes.

The anodizing may include immersing the base metal in an acidic solution and applying a voltage between the base metal and the acidic solution.

The method may further include, before the anodizing, heating the organic semiconductor and the base metal.

The method may further include, after the heating of the organic semiconductor and the base metal, coating a portion of the base metal, which is located on a water surface when the base metal is immersed in the acidic solution, with a polymer The method may further include, after the anodizing, drying an organic semiconductor transistor in a vacuum state.

The method may further include, after the drying, heat-treating the organic semiconductor transistor.

The method may further include, after the arranging of the top layer of the organic semiconductor, forming an insulating layer pattern on the active layer.

BRIEF DESCRIPTION OF THE DRAWINGS

The above and other objects, features and advantages of the present invention will become more apparent to those of ordinary skill in the art by describing exemplary embodiments thereof in detail with reference to the attached drawings, in which.

DETAILED DESCRIPTION OF EXEMPLARY EMBODIMENTS

Hereinafter, exemplary embodiments of the present invention will be described in detail with reference to the accompanying drawings.

However, the technical idea of the present invention is not limited to some embodiments described herein but may be implemented in various different forms, and one or more of components between the embodiments may be selectively combined and substituted without departing from the technical scope of the present invention.

Further, unless specifically defined and described, terms used in the embodiments of the present invention (including technical and scientific terms) may be construed as meanings which are generally understood by those skilled in the art to which the present invention pertains, and generally used terms such as terms defined in a dictionary may be interpreted in consideration of the contextual meaning of the related art.

Further, the terms used herein are intended to describe the embodiments and are not intended to limit the present invention.

In the present invention, the singular forms may include the plural forms unless the context clearly dictates otherwise, and, when a description is made as "at least one (or one or more) of A and B, and C," it may include one or more of all combinations which can be combined with A, B, and C.

Further, in describing components of the embodiments of the present invention, the terms first, second, A, B, (a), (b), and the like can be used.

These terms are intended to distinguish one component from other components, but the nature and the order or sequence of the components is not limited by those terms.

Further, when a component is described as being "connected," "coupled," or "linked" to another component, it may include not only the component being directly connected, coupled, or connected to another component, but the component may also be "connected," "coupled," or "linked" to another component through still another component therebetween.

Further, when a component is described as being formed or disposed "on (above) or under (below)" of another component, the term "on (above) or under (below)" includes not only when two components are in direct contact with each other but also when one or more still another components are formed or disposed between the two components. Also, when described as being "on (above) or under (below)," the term "on or under" may mean not only an upward direction but also a downward direction based on one component.

Hereinafter, embodiments of the present invention will be described in detail with reference to the accompanying drawings, the same reference numerals are given to the same or corresponding components regardless of a number of the drawing, and duplicate descriptions thereof will be omitted herein.

Figure 1:
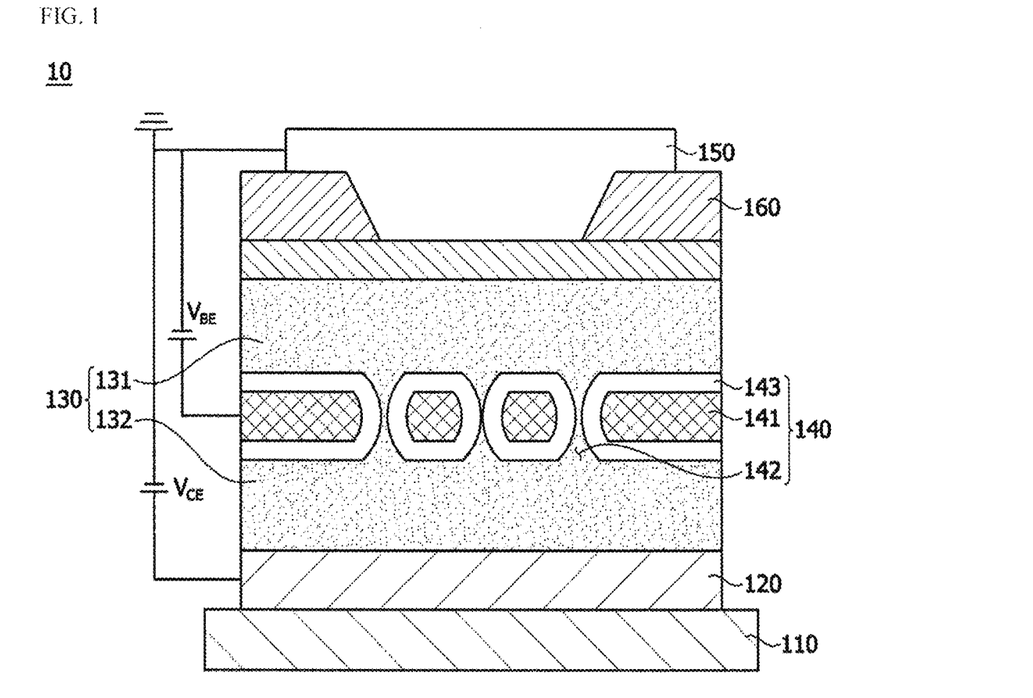
FIG. 1 is a conceptual diagram illustrating an organic thin film transistor (OTFT) according to an embodiment of the present invention.
Figure 2:
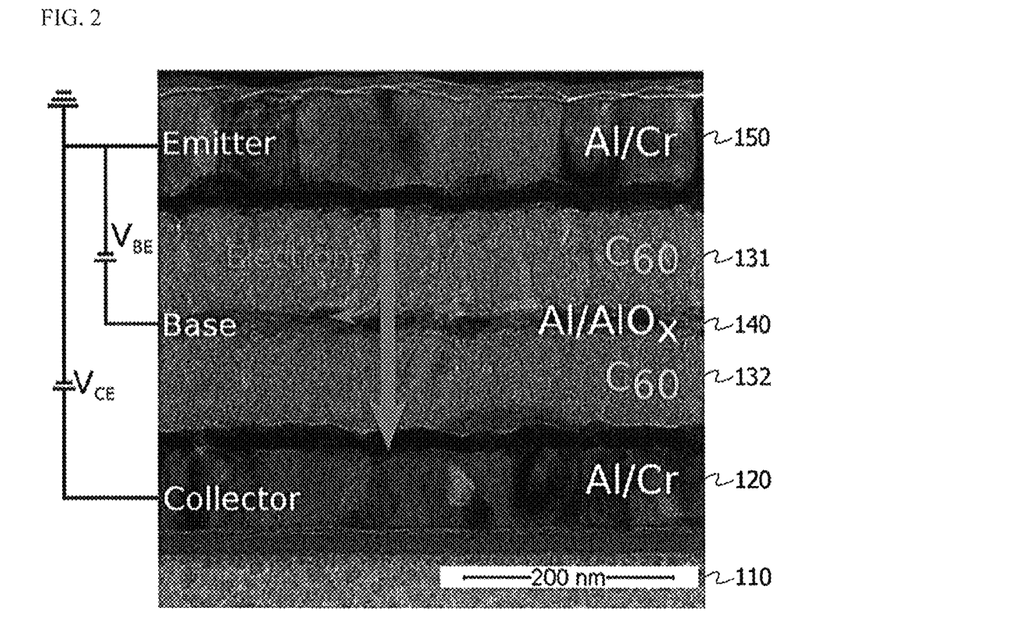
FIG. 2 is a cross-sectional view illustrating the OTFT according to the embodiment of the present invention.

FIG. 1 is a conceptual diagram illustrating an organic thin film transistor (OTFT) according to an embodiment of the present invention, and FIG. 2 is a cross-sectional view illustrating the OTFT according to the embodiment of the present invention. According to FIGS. 1 and 2, an OTFT 100 according to the embodiment of the present invention may include a substrate 110, a first electrode layer 120, an organic active layer 130, a second electrode layer 140, a third electrode layer 150, and an insulating layer 160.

The substrate 110 may be a base supporting an entire structure of the OTFT 100. For example, the substrate 110 may include glass, quartz, a polymer resin (e.g., plastic), silicon, or the like.

The first electrode layer 120 may be disposed on a top surface of the substrate 110. For example, the first electrode layer 120 may be a collector electrode.

For example, the first electrode layer 120 may be formed of any one among gold (Au), copper (Cu), aluminum (Al), an aluminum alloy (Al-alloy), molybdenum (Mo), chromium (Cr), indium tin oxide (ITO), titanium (Ti), neodymium (AlNd), and silver (Ag) or may be formed of a double layer which is made of Cu and Ti, Au and ITO, Mo and AlNd, Au and ITO, or Mo and AlNd. The first electrode layer 120 may be formed through vacuum deposition, but the present invention is not limited thereto.

The organic active layer 130 may be disposed on a top surface of the first electrode layer 120.

The organic active layer 130 may be divided into an upper active layer 131 and a lower active layer 132 based on the second electrode layer 140. The lower active layer 132 may be disposed along the top surface of the first electrode layer 120, and the upper active layer 131 may be disposed along bottom surfaces of the third electrode layer 150 and the insulating layer 160. The organic active layer 130 may be made of a material with high charge mobility and easy charge injection. For example, the organic active layer 130 may be formed of a low-molecular semiconductor material such as oligothiophene or pentacene or formed of a semiconductor polymer material such as polythiophene, a buckminsterfullerene (C60) series, or the like. Doping may be performed along a top surface of the upper active layer 131 or a bottom surface of the lower active layer 132.

The second electrode layer 140 may be disposed in the organic active layer 130 and may include a base electrode 141, a plurality of pinholes 142 formed in the base electrode 141 to provide charge transfer paths, and a metal oxide 143 which surrounds a surface of the base electrode 141 and the pinholes 142.

For example, the base electrode 141 may be made of any one among Al, Ti, Mg, Cu, Ni, Si, Cr, Hf, Sn, Y, and Zn.

For example, the metal oxide 143 may include at least one material selected from the group consisting of yttrium oxide ($Y_2O_3$), aluminum oxide ($Al_2O_3$ or $AlO_x$), magnesium oxide ($MgO_x$), zinc oxide (ZnO), tin oxide (SnO), iron oxide ($Fe_2O_3$ or $FeO_x$), titanium oxide ($TiO_x$), zirconium oxide ($ZrO_2$), chromium oxide ($Cr_2O_3$), hafnium oxide (HfO), beryllium oxide (BeO), tungsten oxide ($WO_x$), copper oxide ($CuO_x$), silicon oxide ($SiO_x$), and nickel oxide ($NiO_x$) (x is a rational number between 1 and 3). In the embodiment of the present invention, although an example in which Al is employed as the base electrode 141 and thus the metal oxide 143 is made of $AlO_x$ is described, it is obvious that the OTFT 100 according to the present invention may be manufactured through the above-described kinds of the base electrode 141 and the metal oxide 143.

The pinhole 142 may be several nanometers in size and provide a charge transfer path between the electrode layers. The upper active layer 131 may be in contact with the lower active layer 132 through the pinhole 142 formed in the base electrode 141. The metal oxide 143 may grow on an exposed surface (including a pinhole side surface) of the pinhole 142 in a unit of several nanometers and serve as a dielectric layer on a surface of the base electrode 141 while maintaining an electron transfer path.

The metal oxide 143 may be formed by an anodizing method.

The metal oxide 143 may be formed by immersing the base electrode 141 in an acidic solution and then applying a voltage between an auxiliary electrode 170 and the base electrode 141 in the acidic solution.

Anodic oxidation may occur in an interface between the base electrode 141 and an electrolyte to passivate an entirety of the surface of the base electrode 141 as a non-porous barrier type metal oxide 143. Further, owing to the formation of a transparent metal oxide layer 143 immediately after the anodizing, an optical appearance of the anodized device may be changed, and decolorization of a structure may provide an indicator of a thickness of the second electrode layer 140.

A thickness and a shape of the metal oxide 143 may be determined by at least one among a pH of the acidic solution, a solution composition, a solution concentration, a dissolved metal ion concentration, a temperature of the acidic solution, a stirring speed of the acidic solution, an applied current density, types of applied current (direct current (DC), alternating current (AC), or pulse current), a metal alloy composition, a pretreatment method, a thickness and a shape of the base electrode 141, and a size and a shape of the auxiliary electrode 170. That is, the thickness and a shape of the metal oxide 143 may be precisely controlled by a process of setting a pH of the acidic solution, a solution composition, a solution concentration, a dissolved metal ion concentration, a temperature of the acidic solution, a stirring speed of the acidic solution, an applied current density, types of applied current (DC, AC, or pulse current), a metal alloy composition, a pretreatment method, a thickness and a shape of the base electrode 141, and a size and a shape of the auxiliary electrode 170.

Figure 3:
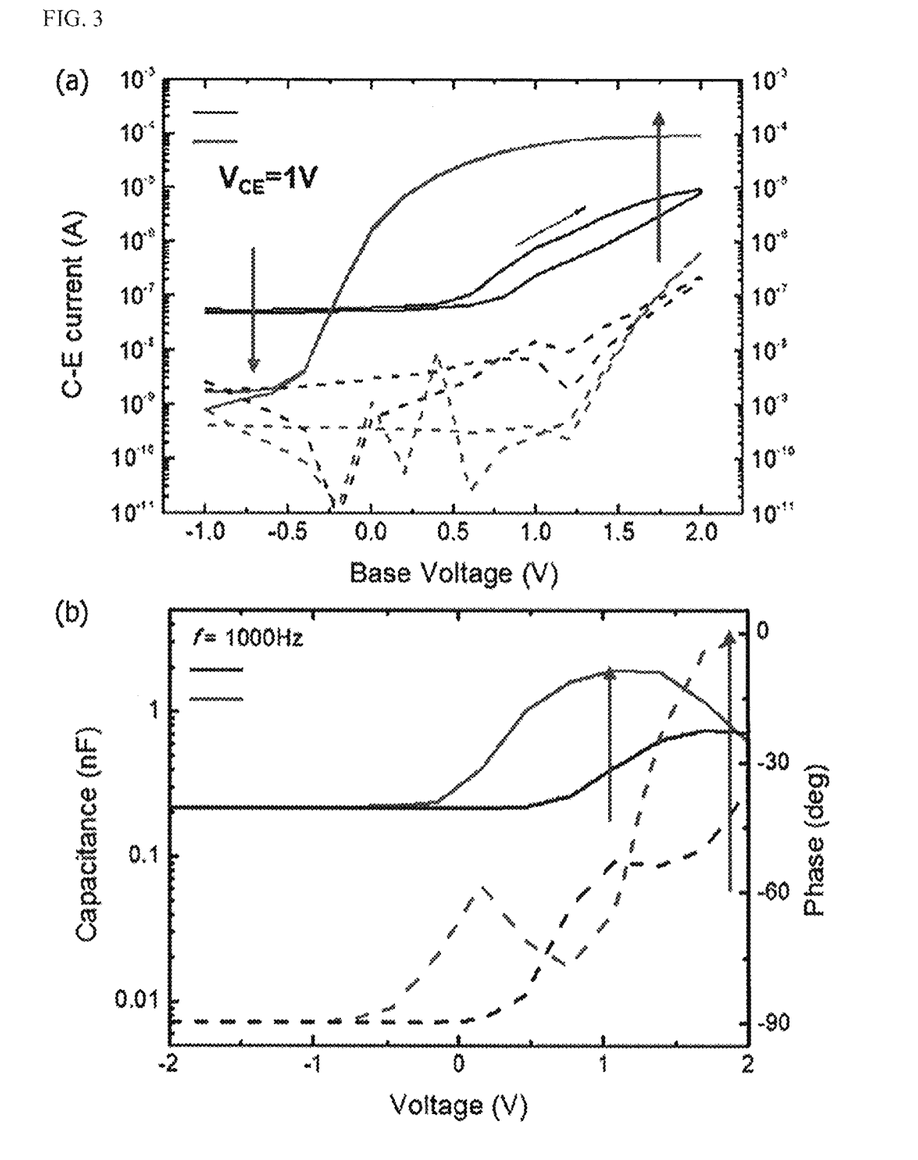
FIG. 3 shows graphs for describing a characteristic of the OTFT according to the embodiment of the present invention.

Further according to the process of setting a pH of the acidic solution, a solution composition, a solution concentration, a dissolved metal ion concentration, a temperature of the acidic solution, a stirring speed of the acidic solution, an applied current density, types of applied current (DC, AC, or pulse current), a metal alloy composition, a pretreatment method, a thickness and a shape of the base electrode 141, and a size and a shape of the auxiliary electrode 170, capacitance of the metal oxide 143 may be increased. Referring to FIG. 3B, it can be confirmed that, when a heat treatment process was not performed, capacitance between a base and an emitter was reduced (shown as a black solid line), and a phase of an impedance signal (shown as a black dotted line) was incompletely varied as a base voltage was increased. However, when the heat treatment process was performed, the capacitance between the base and the emitter was increased (shown as a red solid line), and also the phase of the impedance signal (shown as a red dotted line) was completely changed from −90° to 0° as the base voltage was increased. Therefore, it can be seen that the hard metal oxide formed by anodizing may effectively prevent a leakage current and, simultaneously, a transmission current may pass through the hard metal oxide well during driving.

Further, referring to FIG. 3A, it can be confirmed that the leakage current was lowest at a base-emitter voltage of 1.2 V or less in a measurable range and an on/off ratio was significantly increased to $10^5$ through an anodizing voltage of 2 V and the heat treatment process. Therefore, it can be confirmed that a very dense metal oxide was formed on the base electrode 141 through the anodizing voltage of 2 V and the heat treatment process so that the leakage current may be very effectively prevented and performance of a transistor may be significantly improved.

Figure 4:
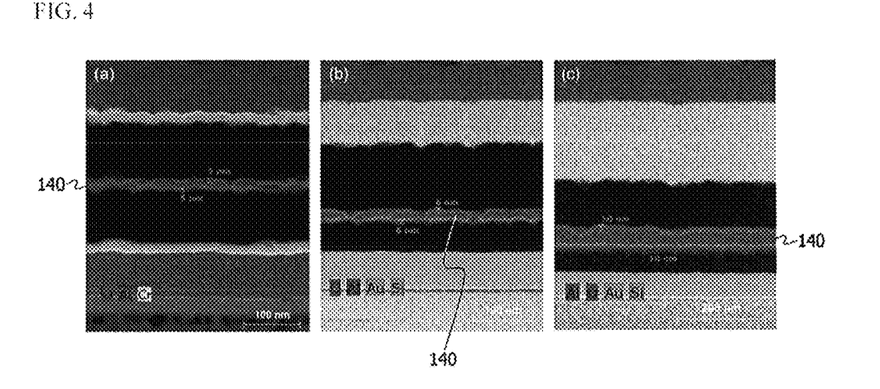
FIG. 4 shows photographs for describing a characteristic of a metal oxide of the OTFT according to the embodiment of the present invention.

FIG. 4A is a cross-sectional view of transmission electron microscopy (TEM) illustrating a base electrode 141 which is dry oxidized and has a thickness of 15 nm, FIG. 4B is a cross-sectional view of TEM illustrating a base electrode 141 which is anodized at an anodizing voltage of 2 V and has a thickness of 15 nm, and FIG. 4C is a cross-sectional view of TEM illustrating a base electrode 141 which is anodized at an anodizing voltage of 4 V and has a thickness of 50 nm. Referring to FIG. 4, in the case of dry oxidation, it can be confirmed that a measured thickness of the metal oxide 143 was 5 nm, and the measured thickness of the metal oxide 143 was increased from 6 nm at the anodizing voltage of 2 V to 10 nm at the anodizing voltage of 4 V. Further, it can be confirmed that, in the case of the dry oxidation, since the formation of the metal oxide was not homogeneous, shapes of the base electrode and the pinhole were deformed, but, in the case of anodizing, the shapes of the base electrode and the pinhole were uniformly preserved. This does not deform the shapes of the base electrode and the pinhole and proves that the thickness of the metal oxide may be precisely controlled by the anodizing voltage. When the base electrode 141 having a thickness of 15 nm, which is conventionally used, is employed, even though the base electrode 141 is anodized by applying an anodizing voltage, a formed thickness of the metal oxide 143 is merely 5 nm and thus a target characteristic of transistor may not be obtained.

Further, when the base electrode 141 is 15 nm in thickness, the upper active layer 131 and the lower active layer 132 can be observed to be connected through a fine pinhole 142. However, when the base electrode 141 is 50 nm in thickness, it can be seen that the fine pinhole 142 is not present so that a connection between the upper active layer 131 and the lower active layer 132 is blocked.

Therefore, when the base electrode 141 of 15 nm in thickness is anodized by an anodizing of 2 V, the OTFT 100 may accurately perform a function of blocking and transmitting charges. It can be observed that the fine pinhole 142 is present through a base metal of a specific thickness and the metal oxide 143 controlled by the anodizing process and having a constant thickness is generated.

Figure 5:
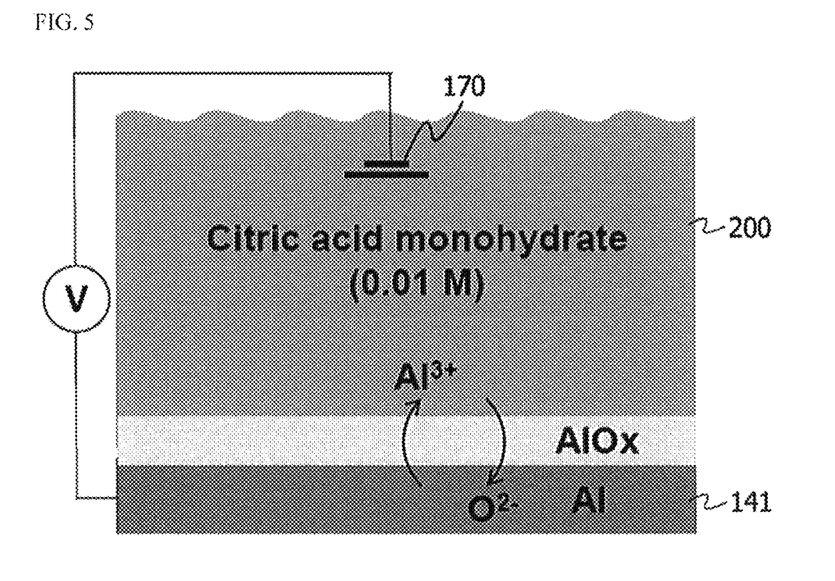
FIGS. 5 and 6 are diagrams for describing an anodizing process according to an embodiment of the present invention.
Figure 6:
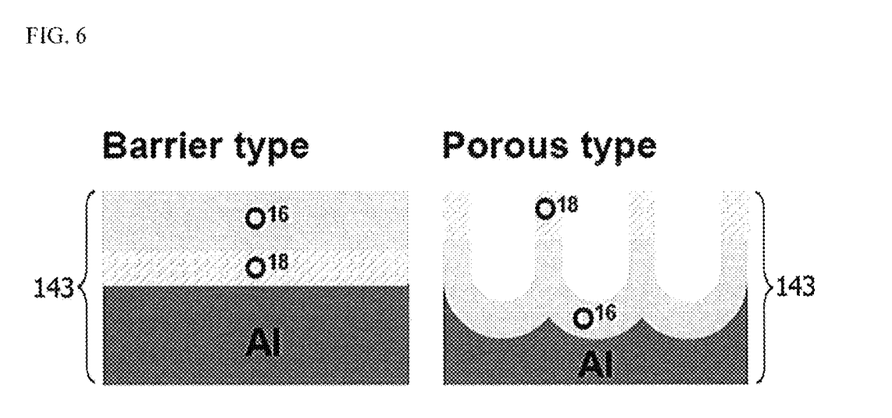

It can be confirmed from FIGS. 5 and 6 that a surface shape of the metal oxide 143 is different according to a process method and the anodizing. When a metal of the base electrode 141 is Al, since $O_2$ molecules in the atmosphere are thermally diffused to an interface between particles of Al, $AlO_x$ which is the metal oxide 143 grows irregularly due to dry oxidation. However, referring to FIGS. 5 and 6, $OH^-$ ions drift to a surface of Al due to a static potential on a uniform surface in an acidic aqueous solution 200 which is an anodizing electrolyte. Therefore, $AlO_x$ which is the metal oxide may uniformly grow on the surface of the base electrode 141 through anodizing. Further, a surface of the fine pinhole 142 which is mainly located at a grain boundary may be uniformly oxidized by anodizing treatment.

Figure 7:
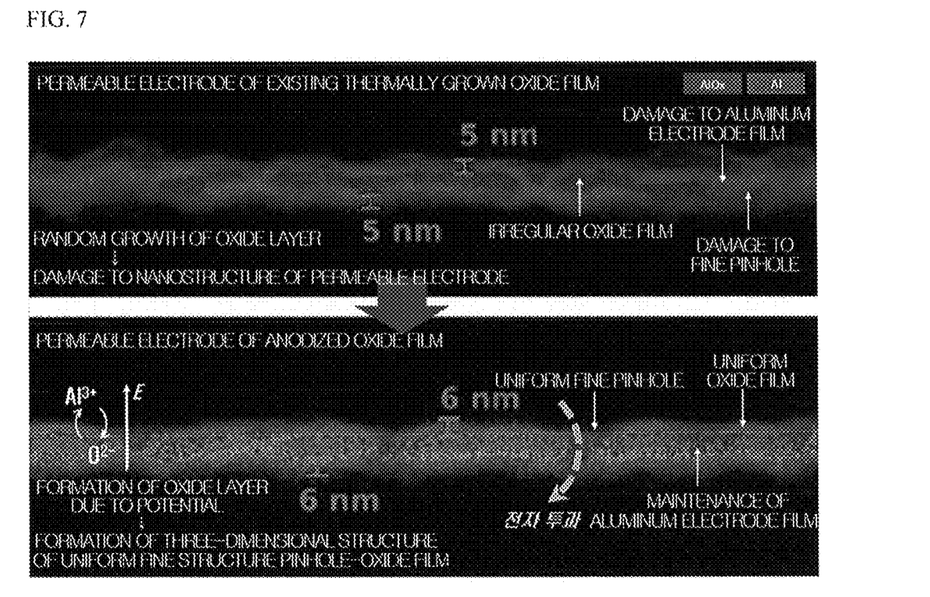
FIG. 7 is a diagram for describing the characteristic of the metal oxide of the OTFT according to the embodiment of the present invention.

Another difference of a surface characteristic which can be confirmed in FIG. 7 is that grain boundary particles of Al of the base electrode were maintained to be large by anodizing treatment, whereas a density and a size of the fine pinhole 142 were reduced. This is consistent with a fact that the anodizing voltage is increased so that a collector current, which is a value in proportion to an amount of charge passing through the base electrode to reach a collector electrode, is decreased. That is, during the anodizing process, an excessive anodizing voltage may cause a low density of the fine pinhole 142.

Further, an oxide film is formed not only on the top surface and a peripheral surface of the anodized base electrode 141, but also in an interior of the nanometer-sized pinhole 142 to passivate an entirety of the base electrode 141 such that a leakage current may be drastically reduced. This may be analyzed from base-collector capacitance analysis according to a thickness below the base electrode 141.

The base-collector capacitance is increased according to a thickness of the base metal. This may mean that the thickness of the anodized metal oxide 143 below the base electrode 141 is reduced at the base electrode 141 that is thicker than the anodized metal oxide 143. This is because infiltration of the electrolyte through the fine pinhole 142 of the base electrode 141 is likely to be blocked as the thickness of the base electrode 141 is increased.

Figure 8:
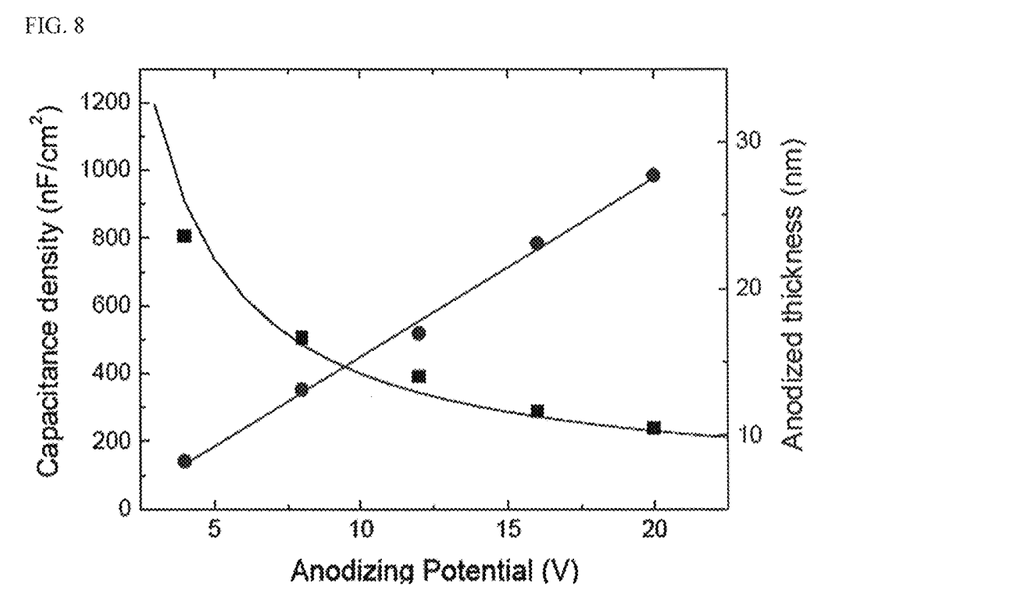
FIGS. 8 and 9 show graphs for describing the characteristic of the metal oxide of the OTFT according to the embodiment of the present invention.

Referring to FIG. 8, when a thickness of the Al base electrode 141 is 15 nm, it can be confirmed that the base-collector capacitance of $AlO_x$, which is the metal oxide 143 below the base electrode 141, was increased two times as compared with the Al base electrode 141 having a thickness of 50 nm at the same anodizing potential of 1 V.

Since a bottom surface of the base electrode 141 facing the collector is passivated due to a C60 layer which is a lower active layer, the bottom surface thereof is less exposed during anodizing. Further, the anodizing treatment increases the thickness of the metal oxide even on the bottom surface of the base electrode 141, but a low phase of impedance data on the base-collector capacitance shows that oxidation is performed relatively incompletely. This represents that the electrolyte may not reach all portions of an interface between the base electrode 141 and the C60 layer.

The third electrode layer 150 may be disposed on the organic active layer 130. For example, the third electrode layer 150 may be an emitter electrode.

For example, the third electrode layer 150 may be formed of any one among Au, Cu, Al, an Al-alloy, Mo, Cr, ITO, Ti, AlNd, and Ag or may be formed of a double layer which is made of Cu and Ti, Au and ITO, Mo and AlNd, Au and ITO, or Mo and AlNd. The third electrode layer 150 may be formed through vacuum deposition, but the present invention is not limited thereto.

The insulating layer 160 may be formed between a portion of the third electrode layer 150 and the organic active layer 130.

The insulating layer 160 may be formed along a portion of the interface between the third electrode layer 150 and the organic active layer 130 to determine a contact area therebetween.

The insulating layer 160 may be formed of a material having a high insulation property, not affecting the organic active layer 130, and forming a pattern: For example, the insulating layer 160 may be formed through a silicon metal oxide 143 through vacuum deposition. Alternatively, an optical resin material not affecting the organic active layer 130 may remain in the form of covering the organic active layer 130 through photolithography to serve as the insulating layer 160. Also alternatively, an organic insulation film may be formed on the organic active layer 130 using an insulating polymer, a polymer, or the like and then an insulating layer 160 having a desired pattern may be formed through etching using an optical resin material.

A transition frequency of the OTFT 100 may exceed 40 MHz. While a transition frequency of the existing OTFT 100 is 40 MHz, the transition frequency of the OTFT 100 according to the embodiments may exceed 40 MHz and may increase to 100 MHz.

A transmission factor of the OTFT 100 may be 99.99% or more. While a transmission factor of the existing OTFT 100 is 99.00% at maximum, the OTFT 100 according to the embodiments may improve a transmission factor to 99.99% in a state of not requiring a complicated manufacturing method. In the embodiments, the transmission factor may be calculated as a ratio between an emitter current and a collector current. That is, the OTFT 100 according to the embodiments may minimize a leakage current to improve a current transfer ratio between the emitter and the collector to 99.9996%.

An on/off ratio of the OTFT 100 may be $10^5$ or more. In the embodiments, the on/off ratio is a ratio between currents flowing in an off state and an on state due to a variation in collector current and may mean a value obtained by dividing an emitter current in the on state by an emitter current in the off state.

Figure 9:
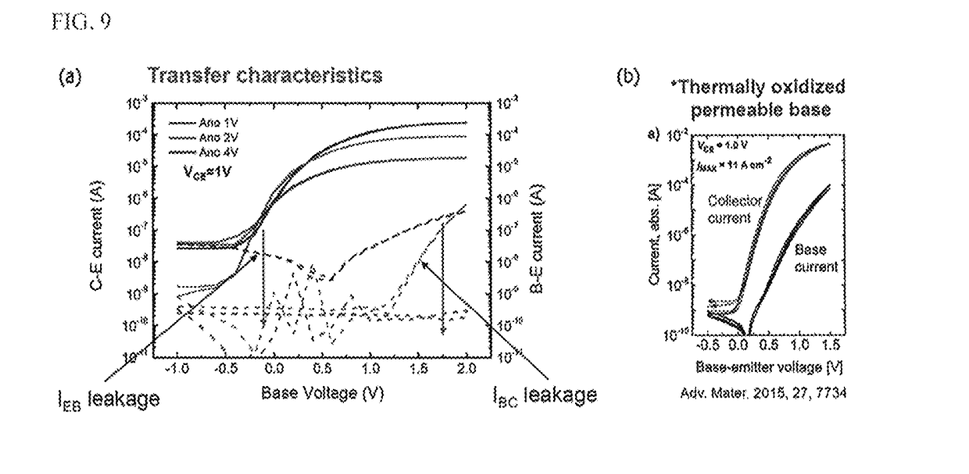

An on-current-density of the OTFT 100 may be 300 $mA/cm^2$ or more. Further, in a transfer curve of the OTFT 100 according to the embodiments, a leakage current (a base current shown in a dotted line) is decreased as the anodizing voltage is increased. It can be confirmed that, referring to FIG. 9A, the OTFT 100 according to the embodiments had the same level of a leakage current as the off state at a driving voltage of 1.2 V, whereas, referring to FIG. 9B, an OTFT manufactured through dry oxidation exhibited a leakage current 10,000 times higher than that in the off state. When the anodizing voltages are 2 V and 4 V, the leakage current of the OTFT 100 according to the embodiments may be maintained at the lowest level in a measurement limit of the transfer curve.

Further, when the anodizing voltage was 2 V, at a collector-emitter voltage of 1 V and the base-emitter voltage of 1 V, the transmission factor was exhibited to be 99.9996% corresponding to a current gain of $2.5 \times 10^5$. This is about four orders of reduction in leakage current as compared with natural oxidation. Further, at an anodizing voltage of 4 V, the leakage current was maintained to be equal to or less than the measurement limit. In a state in which the base current is low and separated from the collector current and the emitter current, the OTFT 100 according to the embodiments may be regarded as a field effect transistor (FET). However, although the transmission factor is increased due to anodic oxidation, an on-current of the transistor may be reduced so as to increase the anodizing voltage. The reduction in on-current can be observed to result from a lower electric base-emitter field across the oxide together with a reduction of the number of pinholes 142.

Owing to improved manufacturing reliability of the OTFT 100 according to the embodiments together with a low static power loss and a reduced leakage current characteristic, there is an advantage of allowing the OTFT 100 to be integrated with a complicated electronic circuit in the future. Further, device capacitance is controlled and a thicker metal oxide is formed so that lower electrode resistance may be induced. Both the above two aspects are important factors to the development of a faster OTFT 100.

Figure 10:
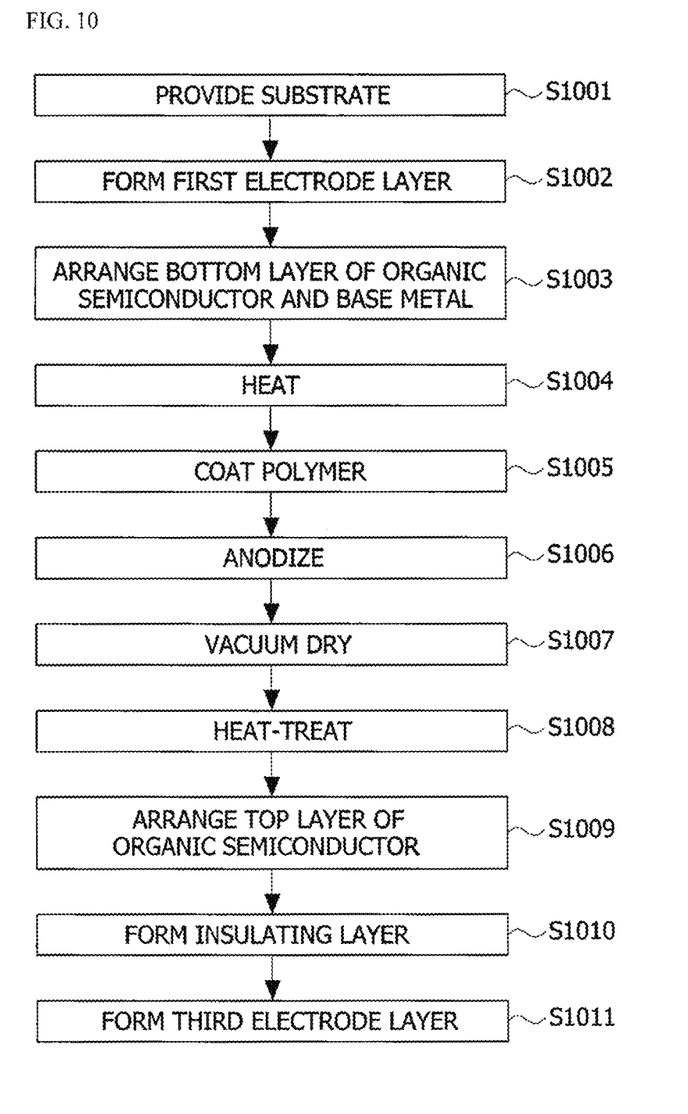
FIG. 10 is a flowchart for describing a method of manufacturing an OTFT according to an embodiment of the present invention.

FIG. 10 is a flowchart illustrating a method of manufacturing an OTFT according to an embodiment of the present invention.

In the method of manufacturing an OTFT according to the embodiment of the present invention, a substrate is provided (S1001).

Next, a first electrode layer is formed on the substrate, and a bottom layer of an organic semiconductor and a base metal are disposed on the first electrode layer. A half-device in which the substrate, the first electrode layer, a lower active layer, and the base metal are disposed may be manufactured on a completely cleaned glass substrate through vacuum evaporation. A thin chromium film (3 nm) improves adhesion of an Au electrode (50 nm), and a C60 layer (50 nm) and Al, which is the base metal, are evaporated on the Au electrode through a series of shadow masks under the condition of an ultrahigh vacuum. Excluding a duration of time of about 1 hour during which anodizing is performed, a sample is taken out from a vacuum chamber and then stored in an inert $N_2$ atmosphere (S1002 and S1003).

Next, before the anodizing, the organic semiconductor and the base metal may be heated. For example, a half device sample in which an upper active layer and an emitter electrode are not formed may be preheated at a temperature of 150° C. for about one hour so as to improve a contact area between the C60 layer and a base electrode and interface adhesiveness therebetween. This improves the interface adhesiveness between an organic active layer and the base electrode. Consequently, base-collector capacitance of the OTFT undergoing the preheating has charge accumulation and a phase shift that are larger than those of base-collector capacitance of an OTFT not undergoing the preheating, and an on/off ratio and a leakage current characteristic of the OTFT undergoing the preheating are significantly improved (S1004).

Next, the base metal may be coated with a polymer. Before the anodizing, coating may be applied outside an active area so as to avoid damage to the electrode from a latent potential peak at a water level (S1005).

Next, the base metal may be anodized. The anodizing of the base metal may include immersing the base metal in an acidic solution and applying a voltage between the base metal and the acidic solution. For example, the anodizing may be performed in a solution of $1 \times 10^{-3}$ M/L citric acid (2-hydroxypropane-1,2,3-tricarboxylic acid) in deionized water. Further, an anodizing voltage ranging from 1 V to 4 V may be applied to an Al counter electrode. The anodizing voltage may be applied until a plateau is reached after 15 to 60 seconds. An effect of the anodizing may be visually confirmed from a variation in surface color of the thin base metal. Owing to the anodizing, a metal oxide may be formed on the base metal (S1006).

Next, an organic semiconductor transistor may be dried in a vacuum state (S1007).

Subsequently, the organic semiconductor transistor may be heat treated. For example, after the anodizing, the sample may be dried for 30 minutes in a medium vacuum condition and then exposed to heat treatment on a hot plate in an $N_2$ atmosphere. Consequently, the sample is returned to a vacuum deposition chamber (<10-6 mbar) and the remaining layers are evaporated (S1008).

Next, a top layer of the organic semiconductor may be disposed on the bottom layer of the organic semiconductor and the base electrode to form the upper active layer. A layer of high efficiency n-type doped W2(hpp)4 (having a thickness of 20 nm and 1 wt % in the C60 layer) may be applied to the upper active layer (S1009).

Next, an insulating layer may be formed on a portion of a surface of the upper active layer. For example, the insulating layer may include silica having a thickness of 100 nm and define an active area by limiting a contact area between an upper portion of the organic active layer, which is formed with a shadow mask and doped, and the emitter electrode to 250 μm×250 μm (S1010).

Next, a third electrode layer may be formed on the insulating layer and the upper active layer (S1011).

The method of manufacturing an OTFT according to the embodiments may expose the C60, which is a main material forming the organic active layer, to the anodizing so that a manufacturing process may be simplified. Further, in spite of the process simplification, there is an effect in that a high current density can be obtained by effectively preventing a leakage current.

In order to apply the anodized OTFT to industries, many devices should be simultaneously processed by integrating the manufacturing process into large-scale production.

During the anodizing process, an electric field is applied from the counter electrode to the base electrode. When the counter electrode is large enough, a uniform electric field may be generated with respect to a plurality of devices on the substrate. This method provides accurate and equally thick metal oxides and provides reliable characteristics of massively produced vertical OTFTs. Further, the anodizing voltage may be applied to a continuous film manufacturing, i.e., a roll-to-roll manufacturing. Contacts of a plurality of base electrodes may be more effectively achieved due to a matching printed circuit board (PCB) having contact pins or by selecting a shadow mask layout in a manner in which all the base electrodes are interconnected. Separation by laser ablation after the anodizing may be efficiently integrated into a-roll-to-roll manufacturing process.

Although the example of a bipolar junction transistor (BJT) has been described in the embodiments of the present invention, it is obvious that the same technical idea can be applied to an FET.

Although the description has been made with reference to the exemplary embodiments of the present invention, it should be understood that various alternations and modifications of the present invention can be devised by those skilled in the art to which the present invention pertains without departing from the spirit and scope of the present invention, which are defined by the appended claims.

What is claimed is:

1. An organic thin film transistor (OTFT) comprising:
    a substrate;
    a first electrode layer disposed on a top surface of the substrate;
    an organic active layer disposed on a top surface of the first electrode layer;
    a second electrode layer disposed in the organic active layer and including a base electrode, a plurality of pinholes formed in the base electrode and providing charge transfer paths, and a metal oxide configured to surround a surface of the base electrode and the pinholes; and
    a third electrode layer disposed on the organic active layer.

2. The OTFT of claim 1, wherein the metal oxide includes at least one selected from the group consisting of yttrium oxide ($Y_2O_3$), aluminum oxide ($Al_2O_3$ or $AlO_x$), magnesium oxide ($MgO_x$), zinc oxide (ZnO), tin oxide (SnO), iron oxide ($Fe_2O_3$ or $FeO_x$), titanium oxide ($TiO_x$), zirconium oxide ($ZrO_2$), chromium oxide ($Cr_2O_3$), hafnium oxide (HfO), beryllium oxide (BeO), tungsten oxide ($WO_x$), copper oxide ($CuO_x$), silicon oxide ($SiO_x$), and nickel oxide ($NiO_x$) (here, x is a rational number between 1 and 3).

3. The OTFT of claim 1, wherein the metal oxide is formed through anodizing.

4. The OTFT of claim 3, wherein the metal oxide is formed by immersing the base electrode in an acidic solution and then applying a voltage between an auxiliary electrode and the base electrode in the acidic solution.

5. The OTFT of claim 4, wherein a thickness and a shape of the metal oxide are determined by at least one among a pH of the acidic solution, a solution composition, a solution concentration, a dissolved metal ion concentration, a temperature of the acidic solution, a stirring speed of the acidic solution, an applied current density, types of applied current (direct current (DC), alternating current (AC), or pulse current), a metal alloy composition, a pretreatment method, a thickness and a shape of the base electrode, and a size and a shape of the auxiliary electrode.

6. The OTFT of claim 1, wherein a transition frequency of the OTFT exceeds 40 MHz.

7. The OTFT of claim 1, wherein a transmission factor of the OTFT is 99.99% or more.

8. The OTFT of claim 1, wherein an on/off ratio of the OTFT is $10^5$ or more.

9. The OTFT of claim 1, wherein an on-current-density of the OTFT is 300 $mA/cm^2$ or more.

10. The OTFT of claim 1, wherein a base electrode is made of Al, and the metal oxide is made of $AlO_x$ which is an anodized base electrode.

11. A method of manufacturing an organic thin film transistor (OTFT), comprising:
    providing a substrate;
    forming a first electrode layer on the substrate;
    arranging a bottom layer of an organic semiconductor and a base electrode on the first electrode layer;
    anodizing the base electrode;
    arranging a top layer of the organic semiconductor on the bottom layer of the organic semiconductor and the base electrode; and
    forming a third electrode layer on an active layer including the organic semiconductor and a base metal,
    wherein the anodizing includes forming a second electrode layer including the base electrode, a plurality of pinholes formed in the base electrode and providing charge transfer paths, and a metal oxide configured to surround a surface of the base electrode and the pinholes.

12. The method of claim 11, wherein the anodizing includes:
    immersing the base metal in an acidic solution; and
    applying a voltage between the base metal and the acidic solution.

13. The method of claim 11, further comprising, before the anodizing, heating the organic semiconductor and the base metal.

14. The method of claim 13, further comprising, after the heating of the organic semiconductor and the base metal, coating a portion of the base metal, which is located on a water surface when the base metal is immersed in an acidic solution, with a polymer.

15. The method of claim 11, further comprising, after the anodizing, drying an organic semiconductor transistor in a vacuum state.

16. The method of claim 15, further comprising, after the drying, heat-treating the organic semiconductor transistor.

17. The method of claim 11, further comprising, after the arranging of the top layer of the organic semiconductor, forming an insulating layer pattern on the active layer.

* * * * *